(12) United States Patent
Lin et al.

(10) Patent No.: US 8,890,318 B2
(45) Date of Patent: Nov. 18, 2014

(54) MIDDLE OF LINE STRUCTURES

(75) Inventors: Qinghuang Lin, Yorktown Heights, NY (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 553 days.

(21) Appl. No.: 13/088,110

(22) Filed: Apr. 15, 2011

(65) Prior Publication Data

US 2012/0261829 A1    Oct. 18, 2012

(51) Int. Cl.
| | |
|---|---|
| H01L 23/48 | (2006.01) |
| H01L 23/52 | (2006.01) |
| H01L 29/40 | (2006.01) |
| H01L 21/768 | (2006.01) |
| H01L 21/311 | (2006.01) |
| H01L 21/3105 | (2006.01) |
| H01L 21/283 | (2006.01) |
| H01L 21/027 | (2006.01) |

(52) U.S. Cl.
CPC ........ *H01L 21/283* (2013.01); *H01L 21/76832* (2013.01); *H01L 21/76816* (2013.01); *H01L 21/311* (2013.01); *H01L 21/76814* (2013.01); *H01L 21/31058* (2013.01); *H01L 21/76829* (2013.01); *H01L 21/0272* (2013.01); *H01L 21/76825* (2013.01); *H01L 21/76828* (2013.01); *H01L 21/76826* (2013.01)
USPC ..... 257/759; 257/734; 257/774; 257/E23.002

(58) Field of Classification Search
CPC ............ H01L 23/5329; H01L 23/5226; H01L 23/532; H01L 23/53276
USPC .................. 257/734, 759, 774, 762, E23.002
See application file for complete search history.

(56) References Cited

U.S. PATENT DOCUMENTS

| | | |
|---|---|---|
| 4,808,545 A | 2/1989 | Balasubramanyam et al. |
| 5,461,003 A | 10/1995 | Havemann et al. |
| 5,651,857 A | 7/1997 | Cronin et al. |
| 5,795,830 A | 8/1998 | Cronin et al. |
| 5,976,768 A | 11/1999 | Brown et al. |
| 5,981,148 A | 11/1999 | Brown et al. |
| 6,007,968 A | 12/1999 | Furukawa et al. |
| 6,014,422 A | 1/2000 | Boyd et al. |
| 6,025,260 A | 2/2000 | Lien et al. |

(Continued)

FOREIGN PATENT DOCUMENTS

KR    100809901 B1    3/2008

OTHER PUBLICATIONS

Non Final Office Action issued on Jun. 18, 2013 for U.S. Appl. No. 13/197,325.

(Continued)

*Primary Examiner* — Shouxiang Hu
(74) *Attorney, Agent, or Firm* — Tutunjian & Bitetto, P.C.; Louis Percello

(57) ABSTRACT

A contact structure includes a permanent antireflection coating formed on a substrate having contact pads. A patterned dielectric layer is formed on the antireflective coating. The patterned dielectric layer and the permanent antireflective coating form openings. The openings correspond with locations of the contact pads. Contact structures are formed in the openings to make electrical contact with the contacts pads such that the patterned dielectric layer and the permanent antireflective coating each have a conductively filled region forming the contact structures.

10 Claims, 6 Drawing Sheets

(56) References Cited

U.S. PATENT DOCUMENTS

| | | | |
|---|---|---|---|
| 6,093,508 A | 7/2000 | Cote | |
| 6,114,082 A | 9/2000 | Hakey et al. | |
| 6,150,256 A | 11/2000 | Furukawa et al. | |
| 6,165,893 A | 12/2000 | Chung | |
| 6,184,041 B1 | 2/2001 | Furukawa et al. | |
| 6,194,268 B1 | 2/2001 | Furukawa et al. | |
| 6,200,726 B1 | 3/2001 | Chen et al. | |
| 6,214,719 B1 | 4/2001 | Nag | |
| 6,221,562 B1 | 4/2001 | Boyd et al. | |
| 6,245,488 B1 | 6/2001 | Furukawa et al. | |
| 6,284,439 B1 | 9/2001 | Holmes et al. | |
| 6,313,492 B1 | 11/2001 | Hakey et al. | |
| 6,338,934 B1 | 1/2002 | Chen et al. | |
| 6,440,635 B1 | 8/2002 | Holmes et al. | |
| 6,492,256 B2 | 12/2002 | Lee et al. | |
| 6,492,732 B2 | 12/2002 | Lee et al. | |
| 6,649,531 B2 | 11/2003 | Cote et al. | |
| 6,780,753 B2 | 8/2004 | Latchford et al. | |
| 6,805,109 B2 | 10/2004 | Cowan | |
| 7,030,031 B2 | 4/2006 | Wille et al. | |
| 7,041,748 B2 | 5/2006 | Lin et al. | |
| 7,056,840 B2 | 6/2006 | Miller et al. | |
| 7,071,532 B2 | 7/2006 | Geffken et al. | |
| 7,091,611 B2 | 8/2006 | Ahn et al. | |
| 7,138,329 B2 | 11/2006 | Lur et al. | |
| 7,253,095 B2 | 8/2007 | Lur et al. | |
| 7,265,013 B2 | 9/2007 | Furukawa et al. | |
| 7,294,568 B2 | 11/2007 | Goodner et al. | |
| 7,294,934 B2 | 11/2007 | Kloster et al. | |
| 7,306,853 B2 | 12/2007 | Lin et al. | |
| 7,338,896 B2 * | 3/2008 | Vanhaelemeersch et al. | 438/638 |
| 7,344,827 B2 | 3/2008 | Takemura et al. | |
| 7,361,454 B2 | 4/2008 | Kobayashi | |
| 7,361,991 B2 | 4/2008 | Saenger et al. | |
| 7,432,041 B2 | 10/2008 | Lin | |
| 7,535,016 B2 * | 5/2009 | Furukawa et al. | 257/20 |
| 7,585,614 B2 | 9/2009 | Furukawa et al. | |
| 7,709,370 B2 | 5/2010 | Allen et al. | |
| 7,919,225 B2 | 4/2011 | Allen et al. | |
| 2001/0021577 A1 | 9/2001 | Brown et al. | |
| 2001/0054766 A1 | 12/2001 | Dirahoui et al. | |
| 2002/0142531 A1* | 10/2002 | Hsu et al. | 438/183 |
| 2002/0158337 A1 | 10/2002 | Babich et al. | |
| 2003/0012539 A1 | 1/2003 | Mule' et al. | |
| 2003/0127426 A1 | 7/2003 | Chang et al. | |
| 2003/0209802 A1* | 11/2003 | Awano | 257/712 |
| 2004/0094821 A1 | 5/2004 | Lur et al. | |
| 2004/0137241 A1 | 7/2004 | Lin et al. | |
| 2005/0009305 A1 | 1/2005 | Anderson et al. | |
| 2007/0099416 A1 | 5/2007 | Furukawa et al. | |
| 2007/0166981 A1 | 7/2007 | Furukawa et al. | |
| 2007/0249170 A1 | 10/2007 | Kewley | |
| 2008/0008969 A1 | 1/2008 | Zhou et al. | |
| 2008/0122106 A1 | 5/2008 | Nitta et al. | |
| 2008/0142995 A1 | 6/2008 | Furukawa et al. | |
| 2008/0150091 A1* | 6/2008 | Lin | 257/635 |
| 2008/0176396 A1* | 7/2008 | Futase et al. | 438/652 |
| 2008/0187731 A1 | 8/2008 | Allen et al. | |
| 2008/0265377 A1 | 10/2008 | Clevenger et al. | |
| 2009/0079075 A1 | 3/2009 | Lin et al. | |
| 2009/0079076 A1 | 3/2009 | Lin et al. | |
| 2009/0081418 A1 | 3/2009 | Allen et al. | |
| 2009/0149026 A1 | 6/2009 | Zhou et al. | |
| 2009/0174067 A1* | 7/2009 | Lin | 257/734 |
| 2009/0233226 A1 | 9/2009 | Allen et al. | |
| 2010/0009131 A1 | 1/2010 | Basker et al. | |
| 2010/0028801 A1 | 2/2010 | Holmes et al. | |
| 2010/0112463 A1 | 5/2010 | Yune | |
| 2010/0197096 A1 | 8/2010 | Johnson et al. | |
| 2010/0314768 A1* | 12/2010 | Darnon et al. | 257/762 |
| 2011/0130006 A1 | 6/2011 | Abatchev et al. | |
| 2011/0304053 A1 | 12/2011 | Lin et al. | |
| 2012/0018891 A1 | 1/2012 | Lin | |

OTHER PUBLICATIONS

Non Final Office Action issued on Feb. 26, 2013 for U.S. Appl. No. 13/197,325.

Lin, Q., et al. "Self-Aligned Airgap Interconnect Structures and Methods of Fabrication" Non Final Office Action for U.S. Appl. No. 13/088,083 mailed on Oct. 24, 2013. (16 Pages).

Final Office Action for U.S. Appl. No. 13/088,083 mailed on Mar. 19, 2014.

Final Office Action mailed on May 27, 2014 for U.S. Appl. No. 13/606,788.

Maenhoudt, M., et al. "Alternative Process Schemes for Double Patterning That Elminate the Intermediate Etch Step" Proc. of SPIE, vol. 6924, 69240P. Feb. 2008. pp. 1-12.

Jung, W., et al. "Patterning With Amorphous Carbon Spacer for Expanding the Resolution Limit of Current Lithography Tool" Proc. of SPIE, vol. 6520, 65201C. Feb. 2007. pp. 1-9.

Jung, W., et al. "Patterning With Spacer for Expanding the Resolution Limit of Current Lithography Tool" Proc. of SPIE, vol. 6156, 61561J. Feb. 2006. pp. 1-9.

* cited by examiner though the contact patterns are formed by lithography on either a regular resist or resist on antireflection coating (ARC) mask stacks or multiple layer mask stacks, such as a tri-layer mask stack, which need to be removed in later steps. Plasma etch processes are used to transfer the contact patterns into the oxide layer by opening the ARC layer, etching through the oxide layer, which typically has a different thickness on the top of gate and source/drain areas of the transistors, and then stopping on the nitride stopping layer. The nitride stopping layer is etched through—stopping on silicide layers on tops of gate and source/drain areas.

MIDDLE OF LINE STRUCTURES

RELATED APPLICATION INFORMATION

This application is related to commonly assigned application Ser. No. 13/088,054 filed on Apr. 15, 2011, and commonly assigned application Ser. No. 13/088,083 filed on Apr. 15, 2011, both incorporated herein by reference.

BACKGROUND

1. Technical Field

The present invention relates to semiconductor contact structures and fabrication methods, and in particular to contact structures made by direct patterning of dielectric material or by image reversal patterning.

2. Description of the Related Art

Typical conventional integration schemes for forming electrical contacts for transistors in a semiconductor chip include depositing a nitride stop layer on top of finished front end of line (FEOL) devices (e.g., transistors). An oxide layer is deposited and planarized. Contact patterns are formed by lithography on either a regular resist or resist on antireflection coating (ARC) mask stacks or multiple layer mask stacks, such as a tri-layer mask stack, which need to be removed in later steps. Plasma etch processes are used to transfer the contact patterns into the oxide layer by opening the ARC layer, etching through the oxide layer, which typically has a different thickness on the top of gate and source/drain areas of the transistors, and then stopping on the nitride stopping layer. The nitride stopping layer is etched through—stopping on silicide layers on tops of gate and source/drain areas.

Current integration schemes and process flows for contact formation etch contact holes and stop on top of the gates and on the top of silicides in the source/drain area. The etching is performed in five steps. These include open ARC, etch oxide (stop on the nitride stop layer), etch the nitride stop layer, strip the resist and ARC and perform a post plasma etching treatment, e.g., Ar plasma sputtering step.

When device pitches shrink down to the sub-80 nm regime, there is no space to accommodate a nitride stop layer between two gates with spacers. Without a nitride stop layer, it is extremely challenging for oxide etching processes to stop on the top of the gate or on the top of source/drain areas without damaging the silicide. Because of the narrowing of pitch spaces between gates, self-aligned contact (SAC) integration schemes are being used to form contacts. The possibility of misalignment in the lithography steps can make the actual openings to the source/drain areas very small, e.g., in the regime of less than 15 nm. This shrinking of contact hole open area can cause severe aspect ratio dependent etching (ARDE) or the so called reactive ion etch (RIE) lag effect. In a case of normal RIE lag, smaller open holes etch slower than those which have larger openings. In some instances, etching can totally stop in very small holes, such as those having diameters less than 10 nm in diameter.

Because of the shrinking of silicide layer thicknesses, e.g., <10 nm for 32 nm nodes and beyond, plasma etching of either the oxide layer or the nitride stopping layer can either thin or damage the silicide layer. Both effects can significantly increase the contact resistances of silicides on the tops of gates and source/drain areas. Because of the shrinking of contact hole openings, a pre-barrier layer deposition clean process, usually a step of plasma etching with Ar sputtering, can sputter oxide from the oxide wall of the holes down to the bottoms of holes to cause an increase in contact resistance.

SUMMARY

An electrically conductive contact structure includes a permanent antireflection coating formed on a substrate having contact pads. A patterned dielectric layer is formed on the antireflective coating. The patterned dielectric layer and the permanent antireflective coating form openings. The openings correspond with locations of the contact pads. Electrically conductive contact structures are formed in the openings to make electrical contact with the contacts pads such that the patterned dielectric layer and the permanent antireflective coating each have a conductively filled region forming the contact structures.

A method for fabricating an electrically conductive contact includes forming a permanent antireflective coating on a substrate; forming an interlevel dielectric composition on the antireflective coating wherein the interlevel dielectric composition includes a material patternable with irradiation and curable to become a permanent interlevel dielectric layer; patterning the interlevel dielectric composition to form contact holes by exposing the interlevel dielectric composition to radiation and developing the interlevel dielectric composition with a chemical solution; curing the interlevel dielectric composition thereby converting the interlevel dielectric composition into a patterned permanent interlevel dielectric layer; opening up the antireflection coating to expose contact pads within the contact holes; and filling the contacts holes with an electrically conductive fill material to form electrically conductive contacts.

Another method for fabricating a contact includes forming a permanent antireflective coating on a substrate; forming a pattern of resist islands in a first resist directly on the permanent antireflective coating, the resist islands occupying volumes where contacts will be formed; filling spaces between the resist islands with an interlevel dielectric composition; removing the resist islands to form contact holes in the interlevel dielectric composition; opening up the antireflection coating to expose contact pads within the contacts holes; and filling the contacts holes with an electrically conductive fill material to form contacts.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
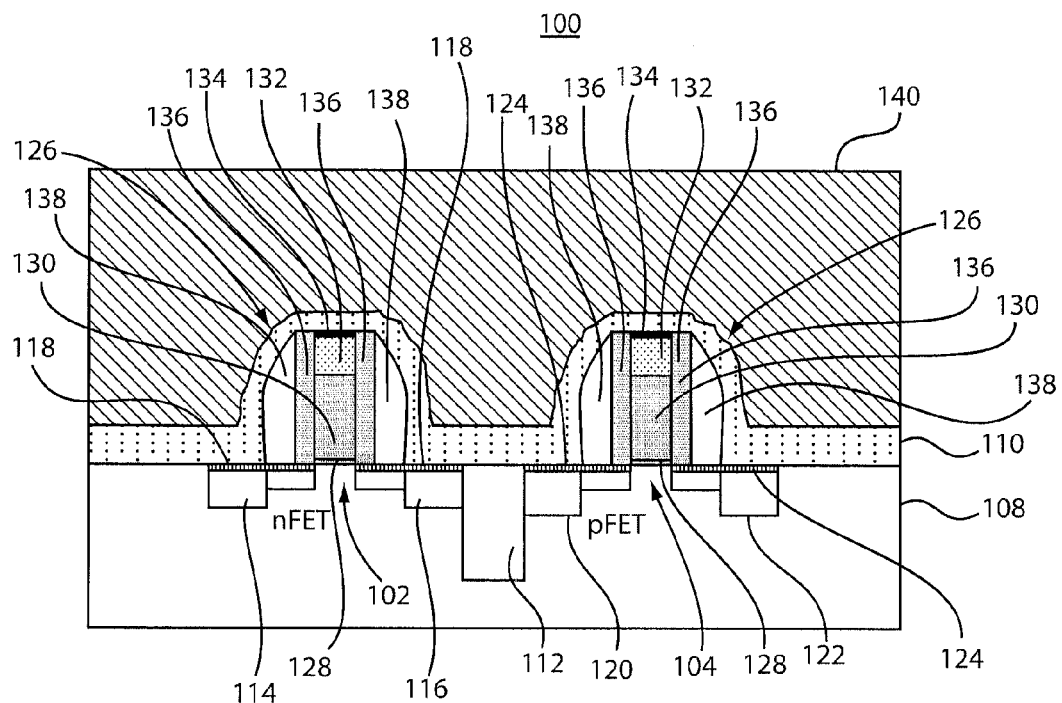
FIG. 1 shows a cross-sectional view of a device having a permanent antireflection coating and a patternable dielectric composition that can be patterned like a resist and can be cured to form a permanent dielectric layer in accordance with one illustrative embodiment.

The present principles provide electrically conductive contact structures and methods for fabrication by direct patterning of the dielectric material or by an image reversal patterning technique. In particularly useful embodiments, new integration schemes are provided to form contacts. Nitride, oxide and resist mask stacks are replaced with a permanent antireflection coating and a patternable dielectric composition, which can be converted to a patterned and cured permanent dielectric layer. The patternable dielectric composition layer is developed to transfer a pattern, i.e., via and/or bars. The dielectric composition layer is cured into a permanent dielectric structural layer to replace the oxide/nitride dielectric stack. It should be understood that the patternable dielectric composition may be formed as the permanent dielectric layer upon deposition.

In some embodiments, drawbacks of conventional integration processes are avoided by, e.g., combining the functions of a photoresist and a dielectric material into one material. This one material, which may be referred to as a patternable low-k (low dielectric constant) material herein, acts as a photoresist during the lithographic patterning process and, as such, a separate photoresist is not required or used herein. After lithographic patterning, the patternable low-k material is subsequently converted into a low-k material with a post patterning cure. In this way, the methods disclosed herein reduce plasma induced dielectric damage and the need for plasma etching, complex sacrificial film stacks and processes needed for patterning these stacks. Moreover, the methods disclosed herein also afford superior pattern profile control.

The patternable low-k material permits the formation of customizable contact hole shapes. The shapes are employed (as reverse images) to be filled by conductive material to form contacts or other structures. This flexibility permits the control of the conductor shape.

An antireflective coating (ARC) may be employed over front end of line structures, such as transistors. An illustrative method for fabricating, e.g., a contact structure, in accordance with one illustrative embodiment may include, depositing an anti-reflective layer on a substrate, depositing a first positive- or negative-tone photoresist (preferably a patternable low-k material) and performing a pattern-wise exposure to irradiation with an inversed-tone mask, e.g., ultraviolet (UV) light, extreme UV (EUV), E-beam, etc. Patterns (e.g., for contact holes) are formed by selective removal of the unexposed (or exposed) areas (e.g., development). Then, the patternable low-k material is cured. The contact holes are filled with a conductive fill material.

In some embodiments, an antireflective coating is formed on the semiconductor substrate. In some embodiments, when an ARC is used, the ARC and patternable low-k materials are part of a permanent dielectric material stack of the interconnect structure.

In another embodiment which employs an image reversal integration scheme, new integration schemes are provided to form electrically conductive contacts. Nitride, oxide and resist mask stacks are replaced with a permanent antireflection coating, a photoresist and a curable dielectric composition, which can be converted to a patterned and cured permanent dielectric layer. The curable dielectric composition fills the openings of the photo resist patterns which form contact holes and bars. The dielectric composition layer is cured into a permanent dielectric structural layer to replace the oxide/nitride dielectric stack.

In accordance with the present principles, a number of photoresist steps and all other sacrificial materials and their related deposition, pattern transfer (etch) and removal process used in prior art integration are reduced. In addition, the need for plasma etching, which is typically employed in patterning processes, is minimized. The reduced use of plasma etching reduces plasma-induced contact damage, thus minimizing the increase in contact resistance of traditional integration schemes. Further, the methods as described herein reduce a number of layers needed to fabricate a contact structure and, as such, reduce the time and cost of fabricating structures as compared to prior art processes.

In the following description, numerous specific details are set forth, such as particular structures, components, materials, dimensions, processing steps and techniques, to provide a thorough understanding of the present principles. However, it will be appreciated by one of ordinary skill in the art that these specific details are illustrative and should not be construed as limiting.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As mentioned above, the interlayer dielectric materials employed herein are preferably materials that act as a low-k (low dielectric constant) dielectric insulator after a cure process. The cured product of an interlayer dielectric material, therefore, can serve as an on-chip dielectric insulator. The terms "cure" or "curing" are used interchangeable to refer to one of the processes selected from a thermal cure, an electron beam cure, an ultra-violet (UV) cure, an ion beam cure, a plasma cure, a microwave cure or a combination thereof. A "cured" product of an interlayer dielectric material is the product of the interlayer dielectric material after it has undergone a cure process. The "cured" product of an interlayer dielectric material may be different from the original interlayer dielectric material in chemical nature and physical, mechanical and electrical properties.

It is to be understood that the present invention will be described in terms of a given illustrative architecture having a semiconductor wafer or substrate; however, other architectures, structures, substrate materials and process features and steps may be varied within the scope of the present invention.

Circuits or structures as described herein may be part of a design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The described embodiments demonstrate image reversal processes. An image reversal is where positively formed (e.g., mask lines, resist lines or features etc.) features will result in negative features being formed (e.g., vias and trenches) and vise versa. The negative features in the present embodiments will then be employed for forming interconnect structures or the like. The interconnect structures are formed without etching interlevel dielectric layers to form trenches or vias. Instead, photoresists are employed to shape these trenches or vias and function as an interlevel dielectric layer. In addition, the interlevel dielectric material can be formed to provide a plurality of different vertical profiles.

Referring now to the drawings in which like numerals represent the same or similar elements and initially to FIG. 1, an illustrative cross-sectional view of front end of line (FEOL) structures is depicted. The structures include a metal oxide semiconductor field effect transistor (MOSFET) 100, which includes a complementary MOS (CMOS) device having an n-FET 102 and a p-FET 104. The n-FET 102 and p-FET 104 are formed in a semiconductor substrate 108. The substrate 108 and the n-FET 102 and p-FET 104 have an antireflection coating (ARC) 110 formed thereon.

The substrate 108 may include a semiconductor substrate, e.g., silicon, GaAS, silicon on insulator, etc. Although the substrate 108 shown is for a FEOL structure, the present principles are applicable to foaming contacts on other layers of a semiconductor device structure. As such, the substrate 108 may include an electrically semiconducting material, an insulating material, a conductive material, devices or structures made of these materials or any combination thereof (e.g., a lower level of an interconnect structure). When the substrate 108 is comprised of a semiconducting material, any semiconductor such as Si, SiGe, SiGeC, SiC, Ge alloys, GaAs, InAs, InP and other III/V or II/VI compound semiconductors, or organic semiconductors may be employed. The substrate 108 may also be a flexible substrate including devices that are suitable for high-speed roll-to-roll processing. In addition to these listed types of semiconducting materials, substrate 108 may also be a layered semiconductor such as, for example, Si/SiGe, Si/SiC, silicon-on-insulators (SOIs) or silicon germanium-on-insulators (SGOIs). These semiconductor materials may form a device, or devices (n-FET 102 and p-FET 104) or structures, which may be discrete or interconnected. These devices and device structures may be for computation, transmission, storage or display of information, such as logic devices, memory devices, switches or display devices.

When the substrate 108 is an electrical insulating material, the insulating material can be an organic insulator, an inorganic insulator or a combination thereof including multilayers. The substrate 108 may also include a patternable low-k dielectric material as well. These electrical insulating materials may be part of a device, or devices or structures, which may be discrete or interconnected. These devices and structures may be for logic applications or memory applications. When the substrate 108 is an electrically conducting material, the substrate may include, for example, polysilicon, an elemental metal, an alloy including at least one elemental metal, a metal silicide, a metal nitride or combinations thereof including multilayers. When the substrate 108 includes a semiconducting material, one or more semiconductor devices such as, for example, complementary metal oxide semiconductor (CMOS) devices, strained silicon devices, carbon-based (carbon nanotubes and/or graphene) devices, phase-change memory devices, magnetic memory devices, magnetic spin switching devices, single electron transistors, quantum devices, molecule-based switches and other switching or memory devices that can be part of an integrated circuit, can be fabricated thereon.

Substrate 108 may include shallow trench isolation structures 112 to prevent charge leakage between devices. The n-FET device 102 includes source and drain regions 114 and 116, which have silicided regions 118 formed thereon. The p-FET device 104 also includes source and drain regions 120 and 122, which have silicided regions 124 formed thereon. The n-FET device 102 and p-FET 104 include gate structures 126. These include a gate dielectric 128 with a gate conductor 130 (e.g., doped polysilicon, or a metal gate for high dielectric constant gate dielectrics). In one embodiment, the gate structures 126 include doped monocrystalline silicon regions 132 with silicided regions 134. The silicided regions 118, 124 and 134 provide landing sites for later formed contacts. The gate structures 128 also include low temperature oxide (LTO) offset spacers 136 and spacers 138 (e.g., nitride).

It should be understood that the device structures shown are illustrative and that other structures, such as FinFETs and device types, such as carbon based transistors and organic transistors, are contemplated and may be employed in accordance with the present principles.

The ARC 110 is formed on a surface of the devices 102, 104 and substrate 108 and, in particular over silicided regions 118, 124 and 134. The silicided regions 118, 124 and 134 form contact pads. The ARC 110 may be a single layer, multilayer or a graded layer with a composition that varies along the vertical direction. The ARC 110: (i) acts as an antireflective coating (ARC) during a lithographic patterning process; (ii) withstands high-temperature processing (e.g., up to about 1000° C.); (iii) prevents patterning film (e.g., resist or a patternable low-k material) poisoning by the substrate 108; (iv) provides sufficient etch selectivity between the patternable low-k material and the ARC layer 110; (v) serves as a permanent dielectric layer in a chip (low dielectric constant, e.g., k<15, more commonly k<7.0); and (vi) is compatible with conventional integration and produces reliable hardware.

Antireflective coatings (ARC) 110 are known to those skilled in the art and include, for example, organic homopolymers or copolymers of polyesters, polyimides, polyacrylates, polymethacrylates, polysulfones, and amorphous carbon that satisfy all of the characteristics of ARC 110 mentioned above. The ARC 110 may be applied by spin-on techniques, spray on techniques, dipping, etc. Inorganic antireflective coatings, such as silicon oxynitride (SiON), silicon carbide (SiC), silicon oxycarbide (SiOC), SiCOH, siloxane, silane, carbosilane, oxycarbosilane, and silsesquioxane, either as a polymer or a copolymer may also be employed and may be deposited, for example, by plasma-enhanced chemical vapor deposition, atomic layer deposition, spin-on techniques, dipping, etc. The ARC 110 may include atoms of M, carbon (C) and hydrogen (H), wherein M is at least one of Si, Ge, B, Sn, Fe, Ta, Ti, Ni, Hf and La. The thickness of the ARC 110 may vary depending on the technique used to form the same as well as the material make-up of the layer. The ARC 110 may have a thickness from about 1 to about 200 nm, with a thickness from about 10 to about 100 nm being more common.

When ARC 110 is a multilayer ARC, the deposition of each layer may be the same or a combination of deposition methods can be used. After applying ARC 110, particularly from a liquid phase, a post deposition baking step is usually needed to remove unwanted components, such as solvent, and to effect crosslinking. The post deposition baking step of ARC 110 may be performed at a temperature from 80° C. to 300° C., with a baking temperature from 120° C. to 200° C. being even more likely. Other post-deposition treatments may be performed.

A resist material, patterning film or patternable low-k material 140 is deposited on the ARC 110. The material 140 may include chemically amplified photoresists, non-chemically amplified photoresists, positive-tone or negative tone. Processing of material 140 may include a deposition process including, for example, spin-on-coating, dip coating, brush coating, and ink-jet dispensing. After applying the material 140, a post deposition baking step may be performed to remove unwanted components, such as solvent. When performed, the baking step is conducted at a temperature from 40° C. to 200° C., with a baking temperature from 60° C. to 140° C. being even more preferred. The duration of the baking step varies from 10 seconds to 600 seconds and is not critical.

The thickness of the material 140 may vary depending on the requirements of a chip being fabricated, the method being employed to faun the same, and the make-up of the material 140. The patternable low-k material 140 may have a thickness from 1 nm to 50,000 nm, with a thickness from 10 nm to 500 nm being preferred. The pattern-wise exposing process can be accomplished in a variety of ways, including, for example, exposure through a mask with a lithography stepper or a scanner with an exposure light source of G-line, I-line (365 nm), DUV (248 nm, 193 nm, 157 nm, 126 nm), Extreme UV (13.4 nm, 6.5 nm), an electron beam, an ion beam, etc. The exposing process may be performed in a dry mode or an immersion mode. The exposing process may be performed with a single exposure or multiple exposures. The pattern-wise exposing process may include direct writing without the use of a mask with, for example, light, electron beam, ion beam, and scanning probe lithography. Other patterning techniques that can be used include contact printing techniques such as nanoimprint lithography, embossing, micro contact printing, replica molding, microtransfer molding, micromolding in capillaries and solvent-assisted micromolding, thermal assisted embossing, inject printing, and the like.

An optional post-exposure baking may be employed to effect the photochemical reactions. When performed, the baking step is conducted at a temperature from 60° to 200° C., with a baking temperature from 80° to 140° C. being even more typical. The duration of the baking step varies and is not critical to the practice of the present invention. When the dielectric layer is permanent it preferably has a dielectric constant of no more than 10, more preferably no more than 4.3. The permanent antireflective coating layer has a dielectric constant of no more than 15, and preferably no more than 7.0.

Figure 2:
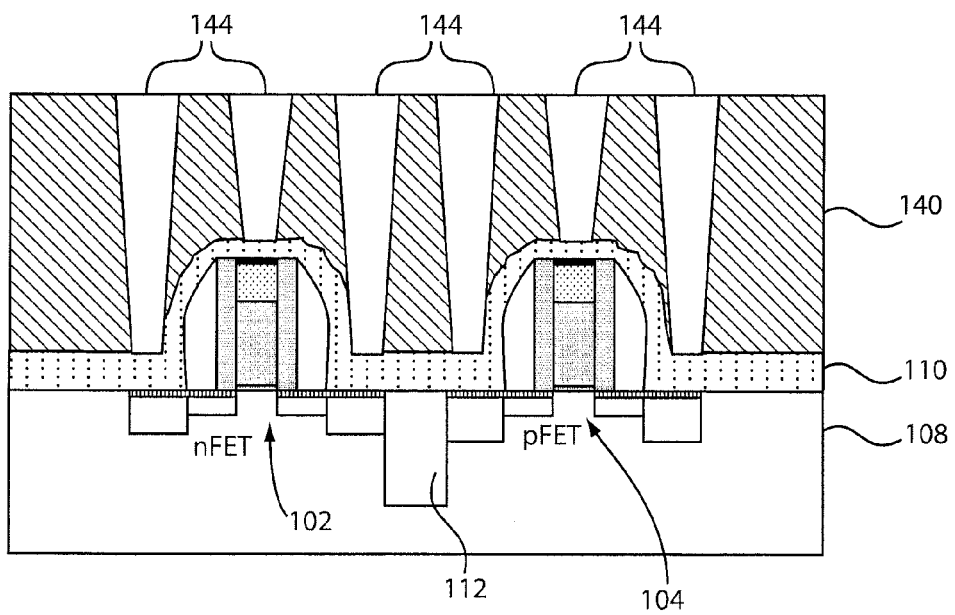
FIG. 2 shows a cross-sectional view of the device having the patternable dielectric composition of FIG. 1 patterned to form contacts holes after a touch-up plasma etch to open the antireflection coating in accordance with one illustrative embodiment.

Referring to FIG. 2, a positive- or negative-tone patternable low-k material 140 is employed to form contact holes 144. The mask is aligned with the silicide regions 118, 124 and 134. The layer 140 is exposed to irradiation and then developed. The holes 144 provide channels to form electrical contacts later. Since the holes 144 are patterned using lithographic methods, the pattern features 144 may be formed with a plurality of different shapes and sizes, as illustratively depicted.

After exposure and post-exposure baking, latent images or patterns are developed into relief images or patterns to form the holes 144 with an appropriate developer, usually an aqueous base solution, such as a 0.26N tetramethylammoniahydroxide (TMAH) solution. A touch-up plasma etch or equivalent process is performed to open up the ARC 110 and expose the silicided regions 118, 124, 134 in the bottom of holes 144.

Figure 3:
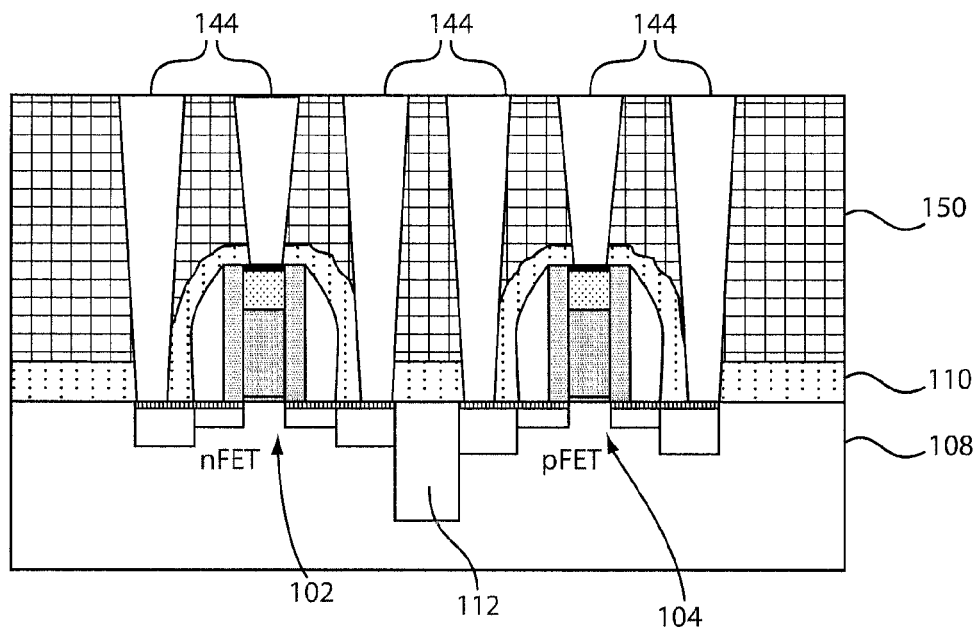
FIG. 3 shows a cross-sectional view of the device showing the patternable dielectric composition of FIG. 2 cured to form a permanent patterned dielectric layer in accordance with one illustrative embodiment.

Referring to FIG. 3, in one preferred embodiment, the patterning film 140 preferably includes a photo-patternable low k (PPLK) material. It is noted that the photo-patternable low k (PPLK) materials employed herein may include any dielectric materials possessing two functions. They act as a photoresist during a patterning process and are subsequently converted into a low-k dielectric insulator during a post patterning cure process. The cured product of a PPLK material, therefore, can serve as a permanent on-chip dielectric insulator. The photo-patternable low k material employed herein can be deposited from a liquid phase. In the present disclosure, the terms "cure" or "curing" are used interchangeable to refer one of the processes selected from a thermal cure, an electron beam cure, an ultra-violet (UV) cure, an ion beam cure, a plasma cure, a microwave cure or a combination thereof.

A "cured" product of a photo-patternable low k material is the product of the photo-patternable low k material after it has undergone one of the aforementioned cure processes. The "cured" product of a photo-patternable low k material is different from the photo-patternable low k material in chemical nature and physical, mechanical and electrical properties.

The term "photo-patternable low k material" (or PPLK) includes a functionalized polymer, copolymer or blend including at least two of any combination of polymers and/or copolymers having one or more acid-sensitive imageable groups. The PPLK material acts as a photoresist and after curing it is converted into a dielectric material having a dielectric constant of about 7.0 or less. It is noted that when the PPLK material is comprised of a polymer, the polymer includes at least one monomer (to be described in greater detail below). When the PPLK material is comprised of a copolymer, the copolymer includes at least two monomers (to be described in greater detail below). The blends of polymers and/or copolymers include at least two of any combination of polymers and/or copolymers described herein.

The PPLK material is a photo-patternable composition including a polymer, a copolymer, or a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

More specifically, the PPLK material that can be employed is a photo-patternable composition comprising a photo/acid-sensitive polymer of one monomer or a copolymer of at least two monomers selected from siloxane, silane, carbosilane, oxycarbosilane, organosilicates, silsesquioxanes and the like. The PPLK material may also be photo-patternable composition comprising a polymer of one monomer or a copolymer of at least two monomers selected from alkyltrialkoxysilane, tetra-alkoxysilane, unsaturated alkyl (such as vinyl) substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

Additionally, the PPLK material may comprise a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

Optionally, the PPLK material may be a photo-patternable composition further comprising at least one microscopic pore generator (porogen). The pore generator may be or may not be photo/acid sensitive.

Illustrative polymers for the PPLK material include, but are not limited to, siloxane, silane, carbosilane, oxycarbosilane, silsesquioxane-type polymers including caged, linear, branched or combinations thereof. In one embodiment, the PPLK material is a photo-patternable composition comprising a blend of these photo/acid-sensitive polymers.

The PPLK material is formed from a photo-patternable composition (negative-tone or positive-tone) that includes at least one of the above mentioned polymers, copolymers or blends, a photoacid generator, a base additive and a solvent used in a photoresist composition. When the PPLK material is a negative-tone photo-patternable material, it may be formed from a patternable composition optionally including an additional cross-linker. By "negative-tone" it is meant that the part of the PPLK material that is exposed to an actinic irradiation will not be removed by a conventional developer, while the unexposed part of the PPLK material is removed.

The additional cross-linker can be a small compound (as compared with a polymer or copolymer) or a polymer, a copolymer, or a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

When the PPLK material is a positive-tone photo-patternable material, it is formed from a patternable composition that includes at least one of the above mentioned polymers, copolymers or blends wherein the polymers, copolymers or blends containing at least photo/acid imageable functional group to form positive-tone patterns, a photoacid generator, a base additive and a solvent used in a photoresist. By 'positive-tone" it is meant that the part of the PPLK material that is exposed to an actinic irradiation will be removed by a conventional developer, while the unexposed part of the PPLK material is not removed. The photoacid generators, base additives and solvents are well known to those skilled in the art.

The patterning film 140 is cured. The curing may be performed with heat, UV, or E-beam. The cured patterning film 140 (with e.g., PPLK material) provides a permanent dielectric material 150 which is employed to insulate conductive structures. Curing is performed by a thermal cure, an electron beam cure, an ultra-violet (UV) cure, an ion beam cure, a plasma cure, a microwave cure or a combination thereof. The conditions for each of the curing processes are known to those skilled in the art and any condition can be chosen as long as it coverts the photo-patternable low k material into a low k film and maintains pattern fidelity.

In one embodiment, an irradiation cure step is performed by a combination of a thermal cure and an ultra-violet (UV) cure wherein the wavelength of the ultra-violet (UV) light is from 50 nm to 300 nm and the light source for the ultra-violet (UV) cure is a UV lamp, an excimer (exciplex) laser or a combination thereof. The excimer laser may be generated from at least one of the excimers selected from the group consisting of $Ar_2^*$, $Kr_2^*$, $F_2$, $Xe_2^*$, ArF, KrF, XeBr, XeCl, XeCl, XeF, $CaF_2$, KrCl, and $Cl_2$ wherein the wavelength of the excimer laser is in the range from 50 nm to 300 nm. Additionally, the light of the ultra-violet (UV) cure may be enhanced and/or diffused with a lens or other optical diffusing device known to those skilled in the art.

In one embodiment, this post patterning cure is a combined UV/thermal cure. This combined UV/thermal cure is carried on a UV/thermal cure module under vacuum or inert atmosphere, such as, in $N_2$, He or Ar. The UV/thermal cure temperature may be from 100° C. to 500° C., with a cure temperature from 300° C. to 450° C. being more common. The duration of the UV/thermal cure is from 0.5 min to 30 min with duration from 1 min to 10 min being more common. The UV cure module is designed to have a very low oxygen content to avoid degradation of the resultant dielectric materials. This post-patterning cure, if performed, may be in different or the same tool cluster as that of the patterning step.

The thickness of the patterned and cured PPLK material 150 may vary depending on the requirements of the chip and the technique used to form the same, as well as the material make-up of the layer. The first PPLK material 150 may have a thickness, e.g., from 1 nm to 50000 nm, with a thickness from 10 nm to 500 nm being preferable.

Figure 4:
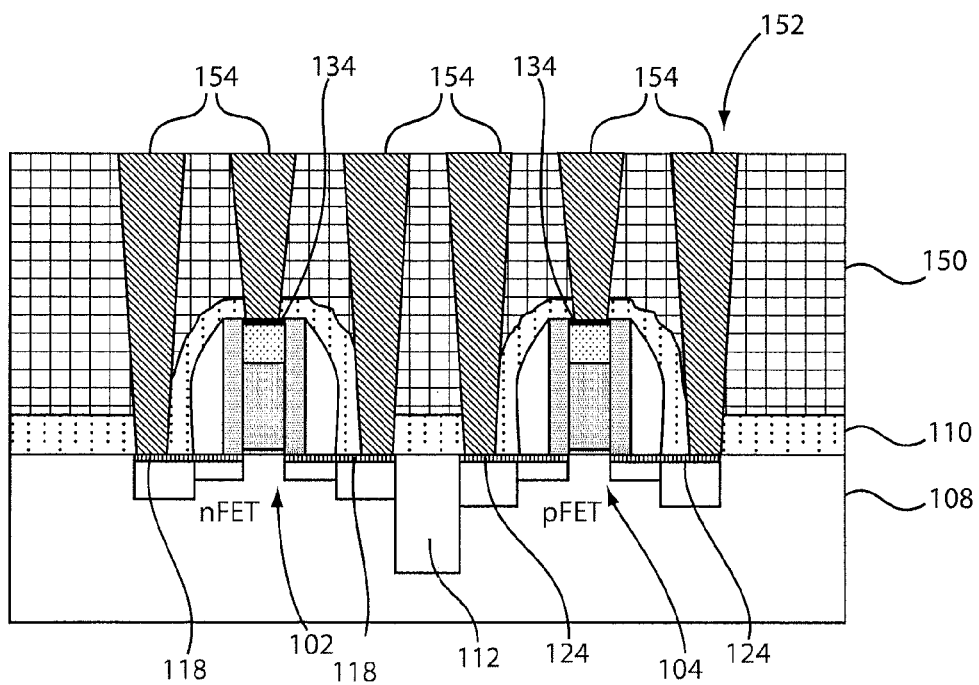
FIG. 4 shows a cross-sectional view of the device showing the contact holes filled to form contacts in accordance with one illustrative embodiment.

Referring to FIG. 4, a metallization process includes depositing a conductor 152 into holes 144 in layer 150 and over a top surface of layer 150. The conductor 152 may include copper, aluminum, tungsten, titanium, tantalum, electrically conductive carbon materials such as carbon nanotubes and graphene, doped polysilicon or any other useful conductive materials, or alloys/combinations thereof. The conductive contact structure as may include a barrier layer when the conductive contact metal is Cu or a conductive catalyst when the conductive carbon materials are employed.

The conductor 152 may be deposited using chemical vapor deposition (CVD), atomic layer deposition, plating, or other deposition techniques or directly grown from the source, drain regions and the gate contact regions. The holes 144 are filled with electrically conductive material 152 which takes the shape of the holes 144.

A chemical-mechanical polish (CMP) is performed to remove excess conductor 152 from the surface of dielectric layer 150 to form contacts 154 in contact with contact pads (e.g., silicides regions 118, 124 and 134) in accordance with the present principles. Other planarization processes may also be employed. It should be understood that the layer 150 is shaped using irradiation and includes a high degree of accuracy without etching open the contact holes 144. Contacts 154 formed within contact holes 144 therefore are more accurately shaped which results in improved reliability. In addition, all contact sizes and shapes with layer 150 are processed simultaneously, which eliminates a plurality of deposition, masking and etching steps—making the process more efficient and less expensive. For example, process steps in the conventional integration schemes, such as, nitride deposition, oxide deposition, oxide CMP, multiple plasma etching steps, including, ARC open, oxide etching, nitride etching, resist stripping, etc. are eliminated. In particular, a nitride stopping layer is eliminated, which has a higher dielectric constant, e.g., k~7.4, compared with a k value of, e.g., about 4.5 of in a PPLK ARC layer (110). This k value reduction can reduce parasitic capacitance between gates and contact metal studs and/or bars, which can result in the improvement of device performance.

Plasma etching steps are eliminated in accordance with the present principles. Plasma etching steps are the most challenging process steps in the contact formation especially in attempting to make conventional self-aligned contact (SAC) integration achievable when gate pitch shrinks down to, e.g., less than 50 nm or so. Eliminating plasma etching steps in accordance with the present principles reduces damage of silicide layers and further improves the contact resistance.

In the present example, the contacts 152 have less width at a lower portion and a greater width at a top portion. The contacts 152 may include other graduated shapes or stepped shapes as well. It should be understood that the silicided regions 118, 124 and 134 represent one type of contact pad. Other types of contact pads may also be employed. Processing can continue using the inventive processes or conventional processes.

Figure 5:
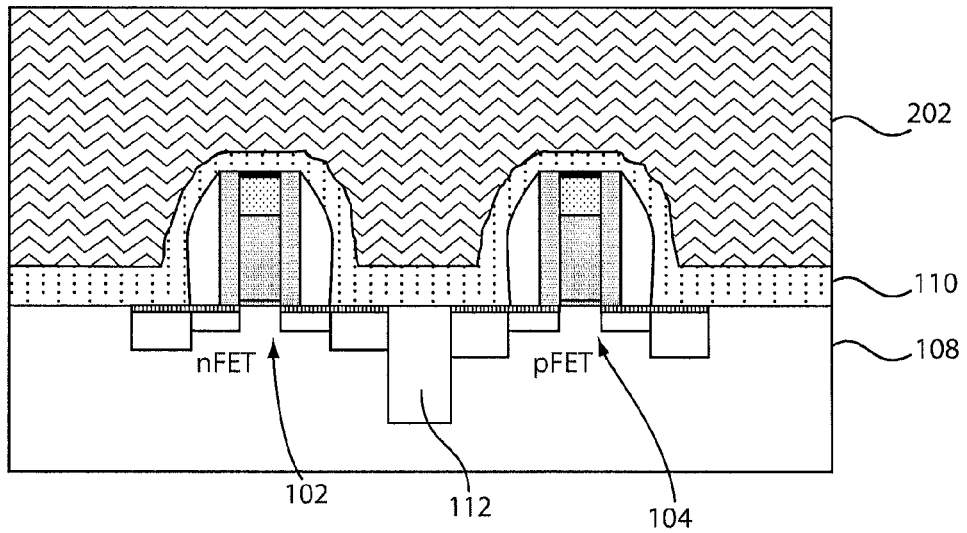
FIG. 5 shows a cross-sectional view of a device having a permanent antireflection coating and a resist layer in accordance with another illustrative embodiment.

Referring to FIG. 5, in another embodiment, resist image reversal is employed to form contact holes in accordance with the present principles. ARC layer 110 and a resist layer 202 are formed as described with reference to FIG. 1. Resist layer 202 may employ a reversed-tone mask and a positive- or negative-tone photoresist to form inverse patterns for contact hole formation.

Figure 6:
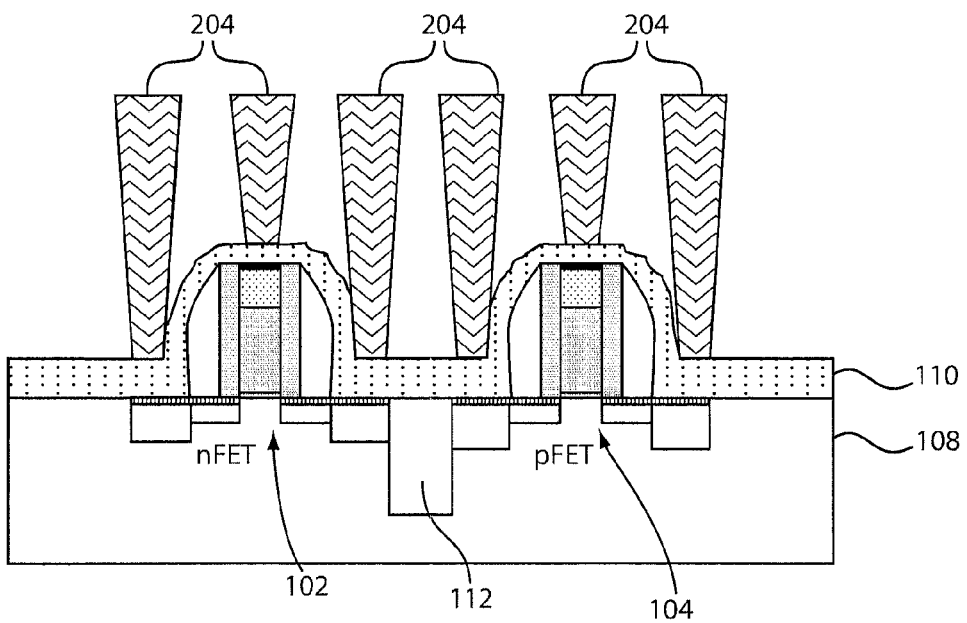
FIG. 6 shows a cross-sectional view of the device of FIG. 5 having the resist layer patterned to form resist islands that create a reverse image for contact holes in accordance with one illustrative embodiment.

Referring to FIG. 6, using a lithographic mask (not shown), resist layer 202 is exposed (or prevented from being exposed) to (from) irradiation to form cross-linked pillars or resist island structures 204. The remaining portions of resist layer 202 are removed by a developer to provide the structure shown. The pattern-wise exposure to irradiation may include, e.g., UV light, e-beam, EUV with an inversed-tone mask.

Figure 7:
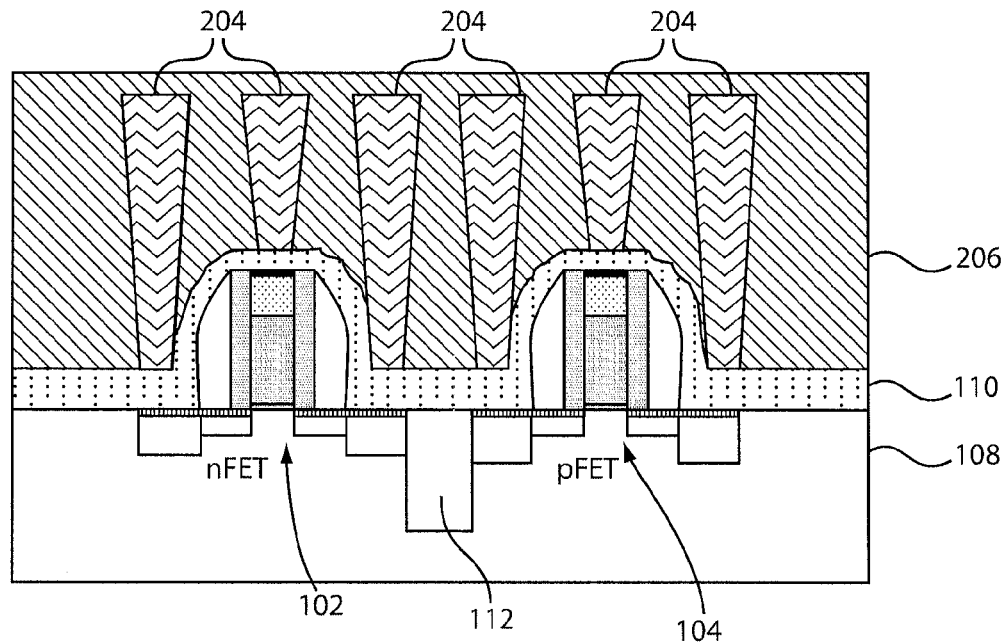
FIG. 7 shows a cross-sectional view of the device of FIG. 6 having the resist islands buried in a patternable dielectric composition that can be patterned like a resist and can be cured to form a permanent dielectric layer in accordance with one illustrative embodiment.

Referring to FIG. 7, a dielectric composition 206 is deposited. The deposition process includes, for example, spin-on-coating, dip coating, brush coating, doctor blade coating, and ink-jet dispensing. The dielectric composition 206 is formulated such that it is compatible with the underlying photoresist pattern 204, i.e., the application of the dielectric composition 206 does not substantially alter the dimension and profile of the resist patterns 204. After applying the dielectric composition 206, a post deposition baking step may be employed to remove unwanted components, such as solvent. When performed, the baking step is conducted at a temperature from 40° C. to 200° C., with a baking temperature from 60° C. to 140° C. being even more preferred. The duration of the baking step varies from 10 seconds to 600 seconds and is not critical.

In one embodiment, the dielectric composition 206 may include a PPLK material, which can be converted into a patterned and cured permanent dielectric layer in later steps. Layer 206 may be applied using a spin-on process or a chemical vapor deposition (CVD) process. The composite layer is formed by filling resist openings wherein the filling should not distort the resist patterns/islands 204. The dielectric composition 206 may include other dielectric materials as well.

Figure 8:
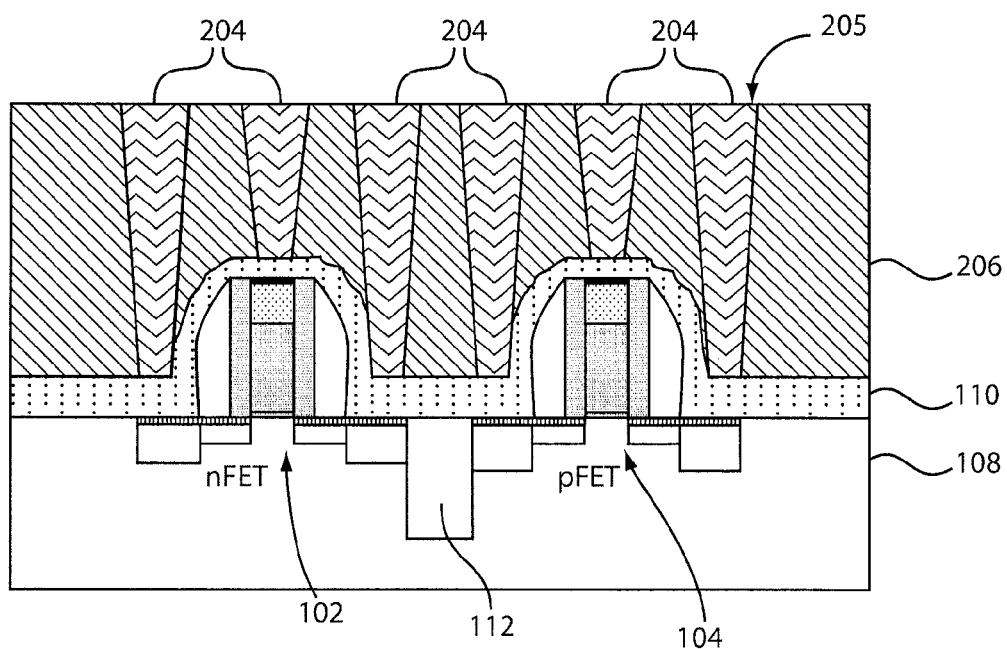
FIG. 8 shows a cross-sectional view of the device of FIG. 7 showing a top surface planarized to expose the resist islands in accordance with one illustrative embodiment.

Referring to FIG. 8, the dielectric layer 206 is planarized using, e.g., a dry or wet etch to expose a top surface 205 of the resist island structures 204.

Figure 9:
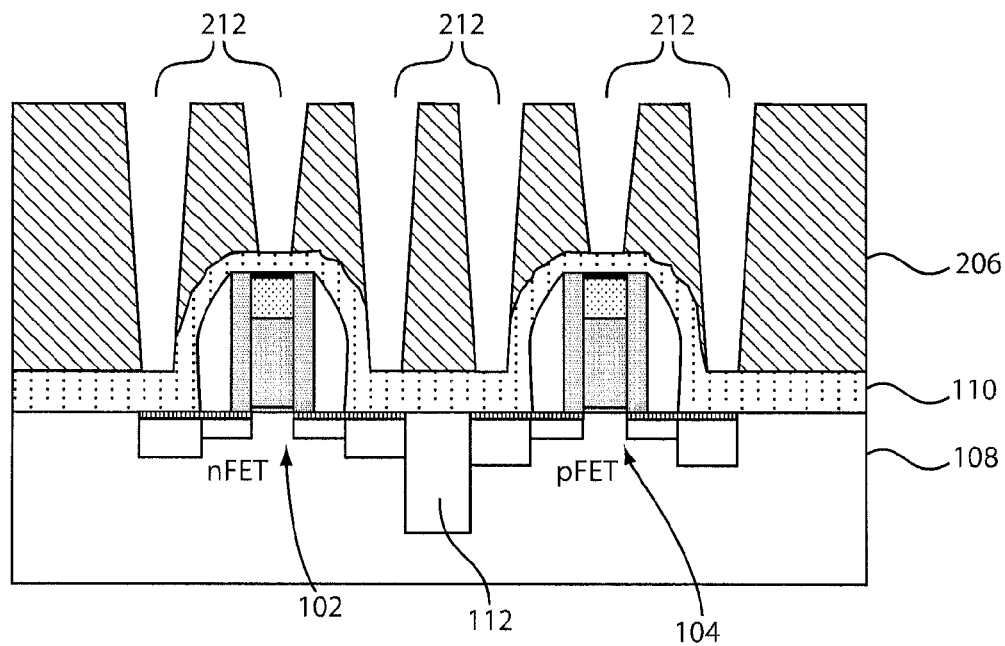
FIG. 9 shows a cross-sectional view of the device having the patternable dielectric composition of FIG. 8 having contact holes after removing the resist islands in accordance with one illustrative embodiment.

Referring to FIG. 9, the resist of the island structures 204 is removed from the resist layer 206 to leave contact holes 212 with ARC 110 remaining at the bottom of the holes 212. This exposes resist island structures 204, which may be removed by a wet method, a dry method, heat, UV light or a combination thereof. In one embodiment, a wet method is employed with an appropriate developer after exposing the dielectric and resist composite structure to a blanket UV irradiation. In another embodiment, a dry method is employed with an appropriate selective reactive ion etching that removes only the exposed resist. In yet another embodiment, a dry method is employed by using heat or UV irradiation to remove exposed resist islands.

Figure 10:
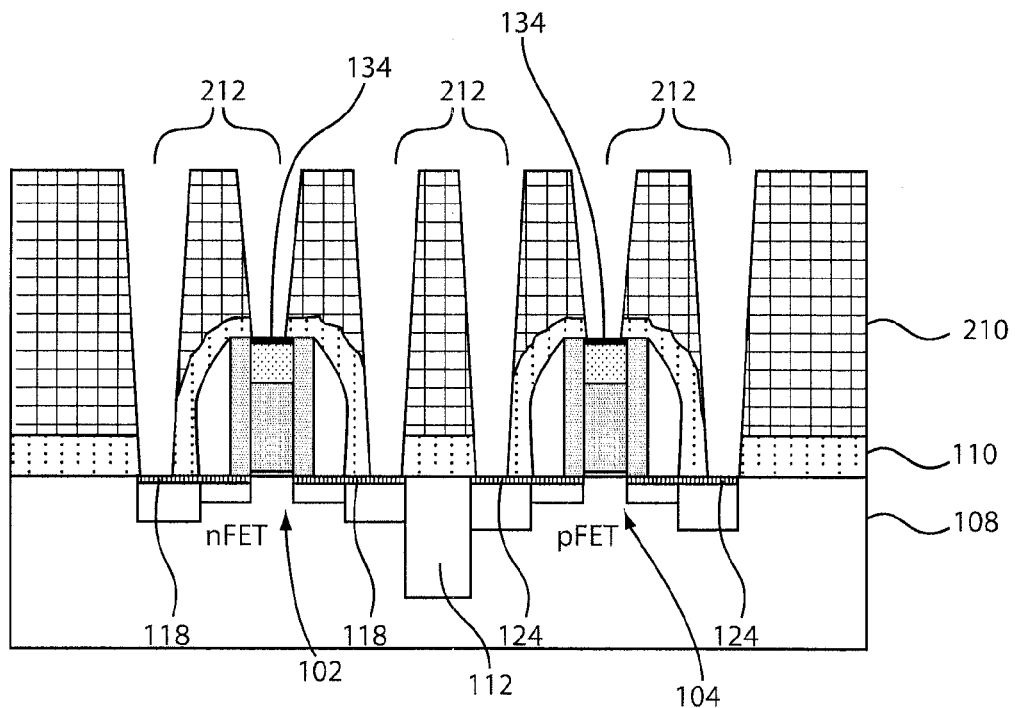
FIG. 10 shows a cross-sectional view of the device of FIG. 9 having the patternable dielectric composition being cured to form a permanent patterned dielectric layer and the antireflection coating opened up to expose contact pads in the contacts holes in accordance with one illustrative embodiment.

Referring to FIG. 10, the layer 206 may be cured as described above to convert the resist layer 206 into a patterned and cured permanent dielectric layer 210. This step is not needed in the layer 206 is formed as a permanent dielectric material (210). The pattern in layer 210 corresponds to contact holes 212 that will be employed to form contacts in later steps. An ARC open process is performed to open the ARC 110 for source, drain and gates contacts. The ARC open process is as described above and exposes the silicided regions 118, 124 and 134 in contact holes 212.

Figure 11:
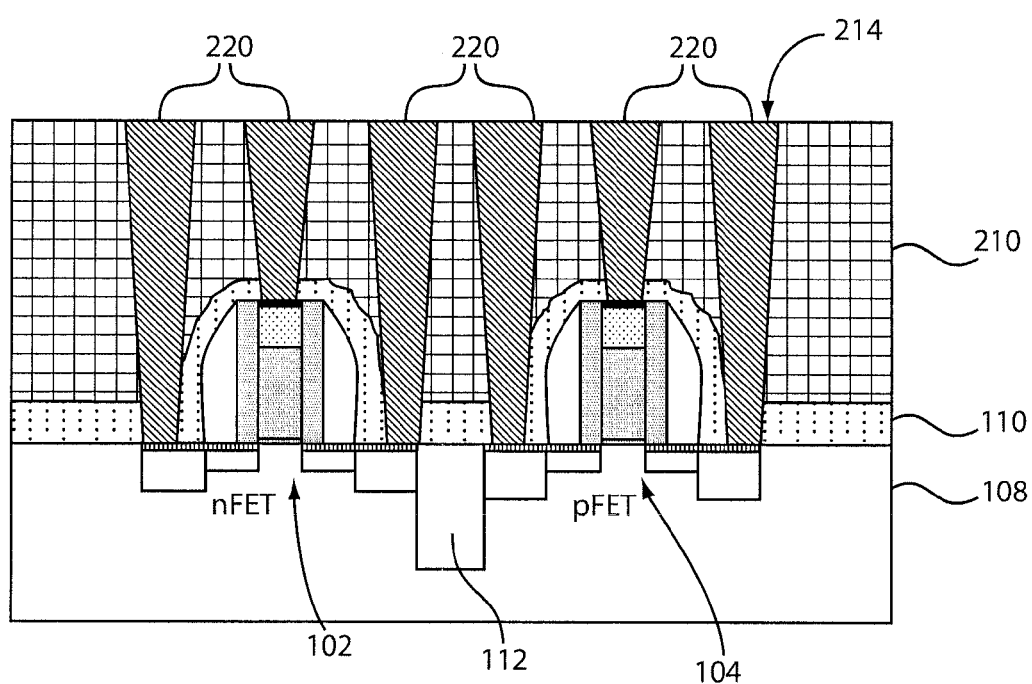
FIG. 11 shows a cross-sectional view of the device of FIG. 10 showing the contact holes filled to form contacts in accordance with one illustrative embodiment.

Referring to FIG. 11, a conductive material 214 is deposited to fill the contact holes 212 and is formed over a surface of the dielectric layer 210. A CMP process may be performed to planarize the top surface. The conductive material may include, copper, aluminum, tungsten, titanium, tantalum, ruthenium their alloys electrically conductive carbon materials such as carbon nanotubes and graphene, doped polysilicon or any other useful conductive material, or alloys/combinations thereof.

This integration scheme forms contacts 220 using a photoresist image reversal method to replace the nitride, oxide, and the resist mask stack of conventional process with a permanent resist base dielectric layer and permanent ARC. The present method reduces many process steps of conventional integration schemes, such as, e.g., nitride deposition, oxide deposition, oxide CMP, multiple plasma etching steps, including, oxide etching, nitride etching, resist stripping, etc. Plasma etching steps are also eliminated.

Having described preferred embodiments for middle of line structures and methods for fabrication (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A contact structure, comprising:
    a patterned permanent antireflection coating formed directly on device formed on a substrate, said device having one or more contact pads;
    at least one patterned dielectric layer formed on the permanent antireflective coating, the at least one patterned dielectric layer and the permanent antireflective coating forming openings therein, the openings corresponding with locations of the contact pads;
    a barrier layer formed in the openings that includes a conductive catalyst; and
    conductive contact structures comprising carbon formed in the openings to make electrical contact with the contact pads such that the at least one patterned dielectric layer and the permanent antireflective coating each have a conductively filled region forming the contact structures,
    wherein the at least one patterned dielectric layer is a cured product of a dielectric composition comprising a polymer, copolymer, or a blend including at least two of any combination of polymers and/or copolymers; and
    wherein the openings in the at least patterned dielectric layer are formed by direct photo patterning of the dielectric composition prior to its curing.

2. The structure as recited in claim 1, wherein the dielectric composition comprises a polymer, a copolymer, or a blend including at least two of any combination of polymers and/or copolymers, wherein said polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

3. The structure as recited in claim 1, wherein the permanent antireflective coating comprises atoms of M, Carbon and Hydrogen wherein M is at least one of Si, Ge, B, Sn, Fe, Ta, Ti, Ni, Hf and La.

4. The structure as recited in claim 1, wherein the least one patterned dielectric layer has a dielectric constant of no more than 10.

5. The structure as recited in claim 1, wherein the permanent antireflective coating layer has a dielectric constant of no more than 15.

6. The structure as recited in claim 1, wherein the conductive contact structures include carbon naotubes or graphene.

7. The interconnect structure as recited in claim 1, wherein the contact pads include electrical connections to one or more of a source region, a drain region or a gate region of a transistor.

8. The interconnect structure as recited in claim 1, wherein the contact pads include silicided regions.

9. The interconnect structure as recited in claim 1, wherein the conductive contact structures include a graduated shape.

10. The interconnect structure as recited in claim 1, wherein the conductive contact structures include a stepped shape.

* * * * *